United States Patent
Hanagasaki

Patent Number: 5,869,859
Date of Patent: *Feb. 9, 1999

[54] DRAM CAPACITOR HAVING LOWER ELECTRODE AND DIELECTRIC LAYER OF SAME PLANAR SHAPE PREFORMED ON FIELD DRAM OXIDE FILM

[75] Inventor: Osamu Hanagasaki, Hamamatsu, Japan

[73] Assignee: Yamaha Corporation, Shizuoka, Japan

[*] Notice: This patent issued on a continued prosecution application filed under 37 CFR 1.53(d), and is subject to the twenty year patent term provisions of 35 U.S.C. 154(a)(2).

[21] Appl. No.: 671,772

[22] Filed: Jun. 19, 1996

[30] Foreign Application Priority Data

Jun. 20, 1995 [JP] Japan ................................ 7-153368

[51] Int. Cl.⁶ .................................................. H01L 27/108
[52] U.S. Cl. ......................... 257/296; 257/306; 257/532
[58] Field of Search ................................... 257/296, 306, 257/310, 311, 410, 411, 532, 516

[56] References Cited

U.S. PATENT DOCUMENTS

| | | | |
|---|---|---|---|
| 4,255,756 | 3/1981 | Shimotori et al. | 257/306 |
| 5,111,355 | 5/1992 | Anand et al. | 257/296 |
| 5,162,890 | 11/1992 | Butler | 2547/306 |
| 5,396,095 | 3/1995 | Wolters et al. | 257/311 |
| 5,397,729 | 3/1995 | Kayanuma et al. | 437/52 |
| 5,420,449 | 5/1995 | Oji | 257/311 |
| 5,470,775 | 11/1995 | Nariani | 437/52 |
| 5,475,248 | 12/1995 | Takenaka | 257/295 |
| 5,498,890 | 3/1996 | Kim et al. | 257/310 |
| 5,578,848 | 11/1996 | Kwong et al. | 257/296 |

FOREIGN PATENT DOCUMENTS 1128460  5/1989  Japan .

OTHER PUBLICATIONS

"Adding Mixed-Signal Capability To A Submicron Digital Asic Process", Subhash R. Nariani, et al., Solid Technology, Aug. 1994, pp. 79–83.

Primary Examiner—Valencia Martin-Wallace
Assistant Examiner—David B. Hardy

[57] ABSTRACT

In a DRAM memory cell built in a semiconductor device, a capacitor is formed on a field oxide film so as not to superpose upon a transistor. An area of the field oxide film can therefore be used efficiently. Since the capacitor can be formed before the transistor is formed, high temperature treatment in forming the capacitor does not give adverse effects on the transistor characteristics. The capacitor dielectric film can be made of material of a high dielectric constant. The capacitor dielectric layer and lower electrode are formed by patterning in succession with the same etching mask. The gate electrode is formed at the same time when the upper capacitor electrode is formed. At the same time when the gate oxide film is formed, an oxide film is formed also on the surface of the capacitor dielectric layer. Pin holes in the dielectric layer are buried by this oxidation. With a reduced number of processes, the additional number of manufacture processes for built-in memory cell in addition to the manufacture processes of logic circuit can be made small. A semiconductor device and its manufacture method are provided which have less load on processes and a small memory cell size.

5 Claims, 6 Drawing Sheets

DRAM CAPACITOR HAVING LOWER ELECTRODE AND DIELECTRIC LAYER OF SAME PLANAR SHAPE PREFORMED ON FIELD DRAM OXIDE FILM

BACKGROUND OF THE INVENTION a) Field of the Invention

The present invention relates to a semiconductor device and more particularly to a structure of a semiconductor device with highly integrated DRAMs and its manufacture method.

b) Description of the Related Art

In large scale integrated (LSI) circuits having mostly logic circuits fabricated by process techniques of 0.5 µm rule, mainly static random access memories (SRAM) are presently used as built-in memories because of its light process load. Since a memory cell of SRAM is formed only by transistors, the memory manufacture processes can be shared with logic manufacture processes.

FIG. 4A shows a general circuit structure of an SRAM. As shown, one memory cell of SRAM requires transistors T1 to T4 constituting a flip-flop and read/write transistors T5 and T6 connected to data/word lines, totalling six transistors.

Since one memory cell of SRAM requires six transistors, it is said a realizable minimum cell size is 50 to 60 µm² even with an ingenious layout pattern. Under a growing trend towards higher integration satisfying demands for large capacity of memories and small size of chips, use of SRAMs does not realize a sufficient integration degree.

In such circumstances, DRAMs simpler in structure than SRAMs are being used in a built-in memory having a capacity of 1 Mbit or larger.

FIG. 4B shows a general circuit structure of a DRAM. One memory cell of DRAM is constituted by one transistor Td and one capacitor Cd. One current terminal of the transistor is connected to the data line, and the other current terminal is connected via the capacitor Cd to the plate line. The gate terminal of the transistor Td is connected to the word line. Read/write of one bit is carried out by charging/discharging the capacitor Cd via the transistor Td. As compared to SRAMs, high integration of DRAMs is possible because of a less number of constituent elements of one memory cell.

Even with DRAMs, however, the structure of a cell capable of further reducing the cell size and realizing higher integration has been desired for a built-in memory having a capacity of 4 Mbit or larger.

Presently, for DRAMs having a memory size of 4 Mbit or larger, a cell structure called a stacked capacitor (STC) type is used dominantly. For DRAMs having a memory size of about 1 Mbit, a cell structure called a planar type is used.

FIG. 5A shows an example of a cell structure of a currently used STC type DRAM. A semiconductor substrate 51 has a field oxide film 52 defining an active region. The active region has a transistor formed therein, the transistor being constituted by source/drain regions made of diffusion layers 53a and 53b (hereinafter the diffusion layer 53a is called a source region and the diffusion layer 53b is called a drain region) and a gate electrode 54a made of a first level polysilicon layer.

A portion encircled by a broken line α in FIG. 5A corresponds to the capacitor. A second level polysilicon film 55 and a third level polysilicon film correspond, respectively, to the lower and upper electrodes of the capacitor. A thin silicon nitride film C1 interposed between the lower and upper electrodes corresponds to the capacitor dielectric layer. This capacitor is formed above the drain region 53b, with the lower electrode 55 being electrically connected to this drain region 53b.

The transistor and capacitor are covered with an interlayer insulating film 57. An interconnection 58 is led from the source region 53a via the contact hole.

This STC type DRAM cell has such a structure that the capacitor is stacked on the transistor. The transistor is therefore required to be formed before the capacitor is formed. A problem therefore arises that capacitor forming processes with heat may degrade the performance of the transistor already formed. In addition, because of its complicated structure, the number of necessary processes is large.

FIG. 5B shows an example of a cell structure of a currently used planar type DRAM. A semiconductor substrate 51 has a field oxide film 52 defining an active region. The active region has a transistor formed therein, the transistor being constituted by a source region 53a, a drain region 53b, and a gate electrode 54a formed on a thin gate oxide film on the substrate surface.

A portion encircled by a broken line β in FIG. 5B corresponds to the capacitor. A shallow impurity diffusion layer 53c is formed in the substrate surface layer continuously with the drain region 53b. On the surface of the impurity diffusion layer 53c, an $SiO_2$ film C2 is formed, on which a first level polysilicon film 54b is formed. The diffusion layer 53c corresponds to the lower electrode of the capacitor, the first level polysilicon film 54b corresponds to the upper electrode, and the $SiO_2$ film C2 corresponds to the dielectric layer. The transistor and capacitor are covered with an interlayer insulating film 57. An interconnection 58 is led from the source region 53a via the contact hole.

In this planar type DRAM cell, it is necessary to form, in addition to the source/drain regions of the transistor, the impurity diffusion layer as the lower capacitor electrode in the substrate surface layer. In this planar type DRAM cell, the capacitor dielectric layer is made of an $SiO_2$ film formed at the same time when the gate insulating film is formed. Since an $SiO_2$ film has a relatively small dielectric constant, a required area of the capacitor is broad in order to retain a necessary capacitance. Because of these reasons, there is a limit in reducing the cell size of a planar type DRAM.

As shown in FIG. 5B, an interconnection 55 made of a second level polysilicon film is being formed in the interlayer insulating film 57 above the capacitor. This interconnection 55 is essential for interconnection to the gate electrode of an adjacent memory cell, and is formed above the capacitor to reduce the cell size. An electrostatic capacitance is therefore generated between the upper capacitor electrode 54b and the interconnection 55. In order to escape the influence of this capacitance, the interlayer insulating film between the interconnection 55 and upper electrode 54b should be made thick.

As above, if SRAM is used as a built-in memory of LSI, the cell size becomes large and high integration is difficult. If STC type DRAM is used as a built-in memory, the manufacture processes become complicated and heat treatments after the formation of MOSFET may degrade the performance of transistors. If planar type DRAM is used, there is a limit in reducing the cell size although the manufacture processes are relatively simple.

SUMMARY OF THE INVENTION

An object of the present invention is to provide a semiconductor device with a semiconductor memory of small cell size having a less process load.

Another object of the present invention is to provide a method of manufacturing a semiconductor device with a small-size semiconductor memory with less process load.

According to one aspect of the present invention, there is provided a semiconductor device with a semiconductor memory comprising: a semiconductor substrate having a surface; an insulating film formed on the surface of the semiconductor substrate and surrounding an active region; a transistor formed in the active region comprising source and drain regions formed in a surface layer of the semiconductor substrate, a gate insulating film formed on the surface of the semiconductor substrate, and a gate electrode formed on the gate insulating film between the source and drain regions; a capacitor formed on the insulating film and having a first conductive layer, a dielectric layer, and a second conductive layer stacked in this order, wherein the second conductive layer and the gate electrode are formed from a same layer.

The gate insulating film may be a silicon oxide film formed through thermal oxidation and the dielectric layer may include a silicon nitride film and a thermally oxidized film formed on the surface of the silicon nitride film.

According to another aspect of the present invention, there is provided a method of manufacturing a semiconductor device with a semiconductor memory comprising the steps of: preparing a semiconductor substrate having a surface including an active region with an exposed semiconductor surface and an insulating film surrounding the exposed semiconductor surface; forming a first conductive layer and a dielectric layer on the insulating film; forming a gate insulating film on a surface of the active region; depositing and patterning a conductive layer to form a gate electrode on the gate insulating film and a second conductive layer on the dielectric layer; and forming source and drain regions in the active region on both sides of the gate electrode.

The step of forming the first conductive layer and the dielectric layer may include a step of depositing a first layer for forming the first conductive layer and a second layer for forming the dielectric layer and a step of continuously etching the first and second layers with the same etching mask.

The step of forming the gate insulating film may include a step of oxidizing the surface of the dielectric layer at the same time.

The capacitor constituting a built-in memory is formed on an insulating film surrounding the active region, for example, on the field oxide film. The area of the field oxide film can be efficiently used since the capacitor is formed on the field oxide film.

The capacitor is not formed over the transistor, so that it can be formed before the transistor is formed. Since the capacitor is formed prior to the formation of the transistor, adverse effects can be avoided which might be caused by processes at a high temperature necessary for the formation of the capacitor.

If a silicon nitride film is used as the capacitor dielectric layer, a necessary capacitance can be retained with a smaller area than using an $SiO_2$ film, and so the cell area can be reduced.

The upper capacitor electrode and transistor gate electrode can be formed at the same time by one film forming process and one patterning process. The number of processes can be reduced correspondingly.

If an oxide layer is formed on the surface of the dielectric layer at the same time when the gate oxide film of the transistor is formed, it becomes possible to eliminate pin holes in the silicon nitride film and to improve the electrical characteristics of the dielectric layer, without increasing the number of processes.

As above, it is possible to lessen process load required in addition to general manufacture processes of a logic circuit and to reduce the cell size of a memory. Not only the size of a chip but alto the number of processes can be reduced. Accordingly, manufacture yield of chips can be improved and manufacture cost of chips can be reduced.

DETAILED DESCRIPTION OF THE PREFERRED EMBODIMENTS

1. Memory Cell Structure

First, with reference to FIG. 1, the cross sectional structure of a DRAM memory cell according to an embodiment of the invention will be described. This DRAM memory cell is fabricated in an LSI, together with logic circuits.

Figure 1:
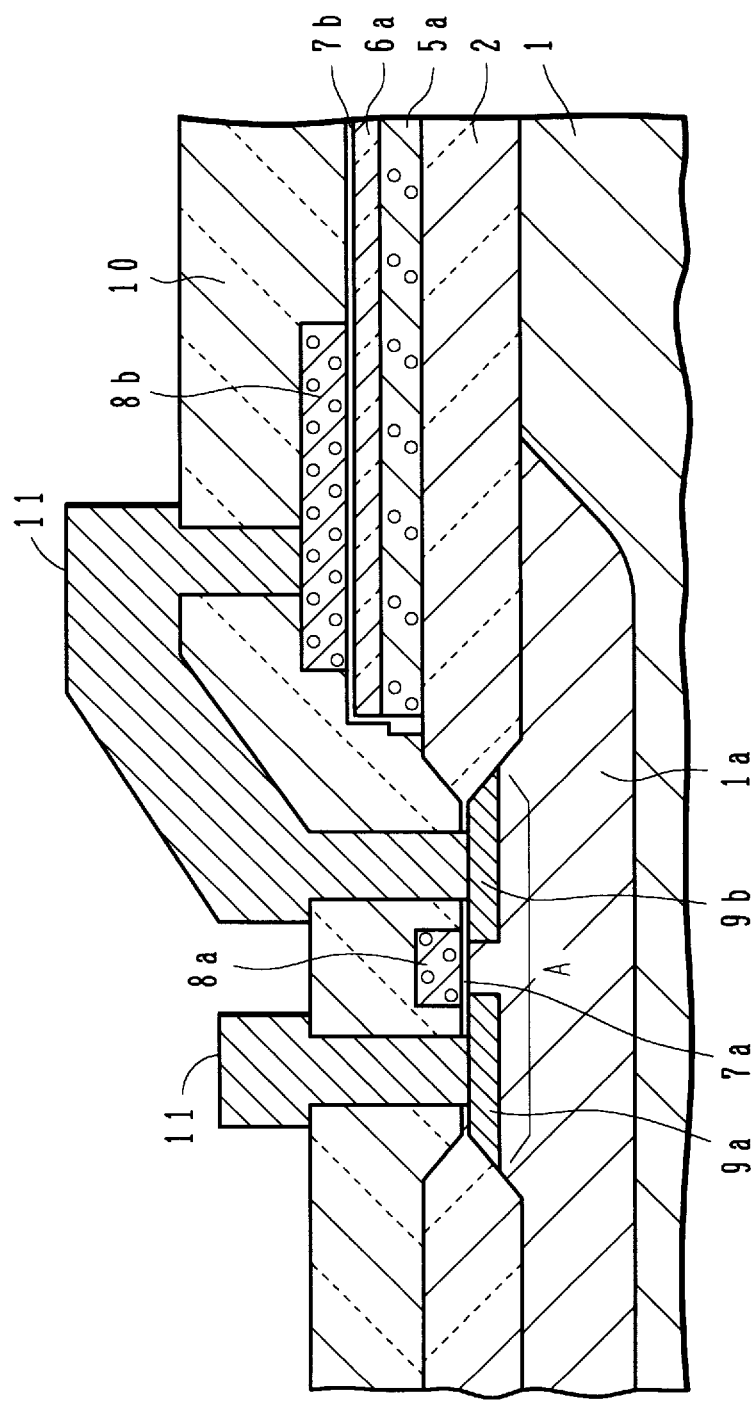
FIG. 1 is a cross sectional view/of a memory cell according to an embodiment of the invention.

As shown in FIG. 1, a surface layer of an Si semiconductor substrate 1 has in its partial area a p-type well 1a diffused with p-type impurities. The semiconductor substrate 1 has a thick field oxide film which defines an active region A in the surface layer of the p-type well 1a.

The active region A has a transistor formed therein. This transistor is constituted by: an n-type source region 9a and an n-type drain region 9b formed in the surface layer of the p-well 1a; a thin gate oxide film 7a above the channel region between the source and drain regions 9a and 9b; and a gate electrode 8a on the gate oxide film 7a. The same structure is also given to n-channel transistors of the logic circuits.

A capacitor is formed on the field oxide film 2. On the field oxide film 2, a lower electrode 5a of the capacitor is first formed by a polysilicon film. A dielectric layer 6a of a silicon nitride film is formed on the lower capacitor electrode 5a. The lower electrode 5a and dielectric layer 6a have the same plane shape. The side walls of the lower capacitor elelectrode 5a and the side walls and upper surface of the silicon nitride film 6a are covered with a thin oxide layer 7b.

An upper electrode 8b of the capacitor is formed on the oxide film 7b. The upper electrode 8b is formed by a polysilicon film same as the gate electrode 8a of the transistor.

The transistor and capacitor are covered with an interlayer insulating film 10 formed over the substrate surface. Interconnections 11 are led from the source and drain regions 9a and 9b and the upper capacitor electrode 8b via contact holes formed in the interlayer insulating film 10. The drain region 9b and upper electrode 8b are connected together by the interconnection 11.

As above, the capacitor of the semiconductor memory cell of this embodiment is formed on the field oxide film.

Although the field oxide film is essential for the isolation of transistors or the like, its area can be efficiently used by forming the capacitor on this film. Still further, the transistor region and capacitor regions are not superposed so that as will be later detailed, it is possible to form the capacitor before the transistor, i.e. the source/drain regions of the transistor, is formed.

The dielectric layer constituting the capacitor uses a silicon nitride film having a dielectric constant larger than an $SiO_2$ film. Therefore, capacitance per unit area can be increased and the capacitor area can be reduced, as compared to the case of using the $SiO_2$ film as the dielectric film.

Figure 5A:
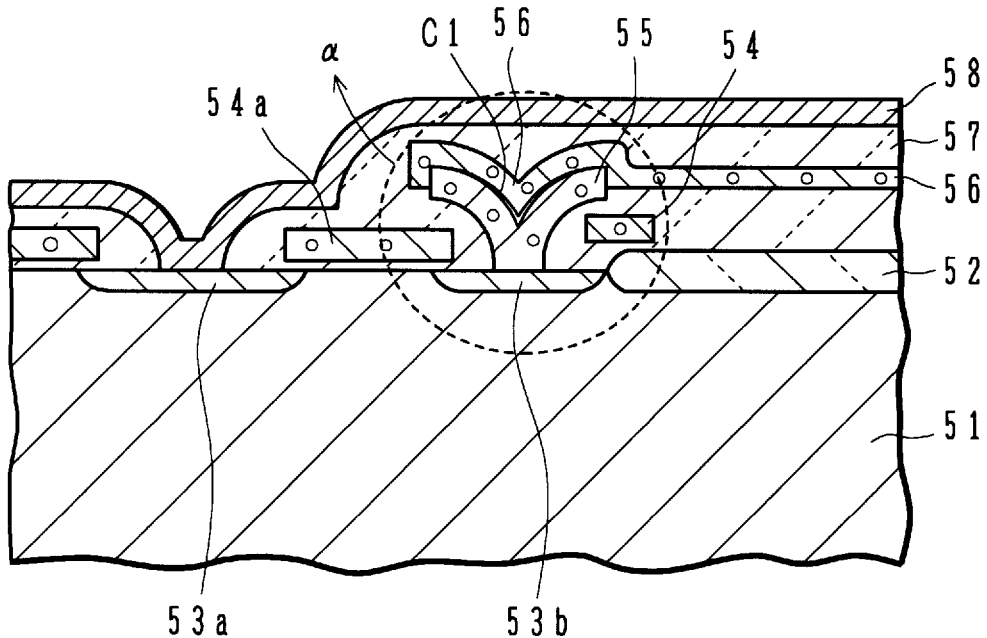
FIGS. 5A and 5B are cross sectional views of conventional semiconductor memory cells.
Figure 5B:
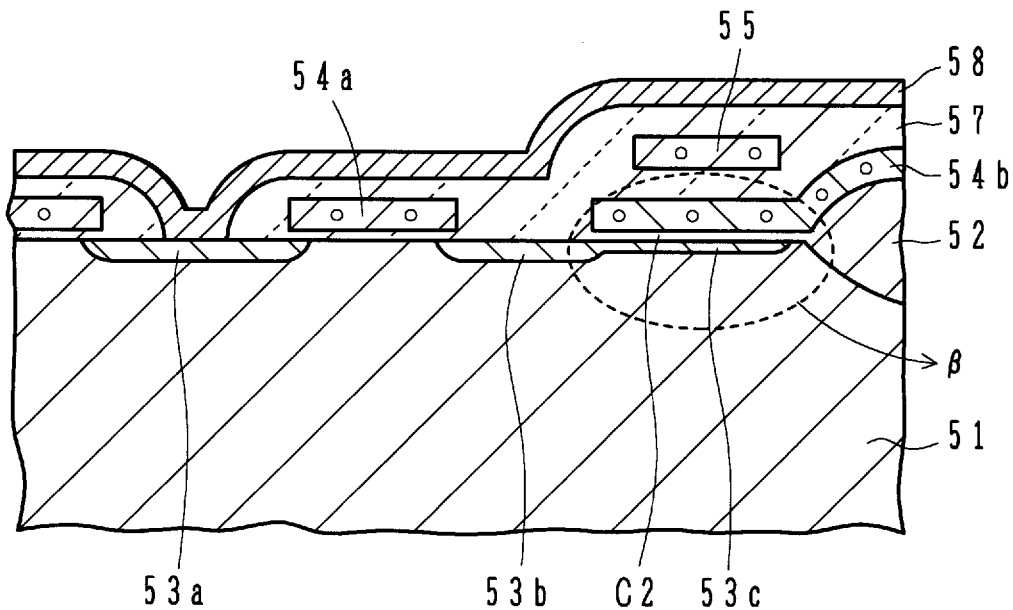

The DRAM memory cell of this embodiment does not form an interconnection in the interlayer insulating film above the capacitor like the conventional planar type DRAM shown in FIG. 5B. It is therefore unnecessary to consider the influence of the capacitance between the upper capacitor electrode and the interconnection, and the interlayer insulating film is not required to be thick, shortening a time required for forming the interlayer insulating film.

The oxide layer 7b is formed on the surface of the silicon nitride film 6a. Although this silicon nitride film 6a is desired to be thin in order to obtain a large capacitance of the capacitor, a thin silicon nitride film may contain defects such as pin holes. The oxide layer on the surface of the silicon nitride film 6a functions to eliminate these pin holes and warrant the quality of the capacitor.

The upper capacitor electrode 8b and transistor gate electrode 8a are both formed by a polysilicon film so that as will be later described, both the electrodes may be formed at the same time.

2. Manufacture Method of Memory Cell

A method of manufacturing a DRAM memory cell of the embodiment shown in FIG. 1 will be described with reference to FIGS. 2A to 2F.

Figure 2A:
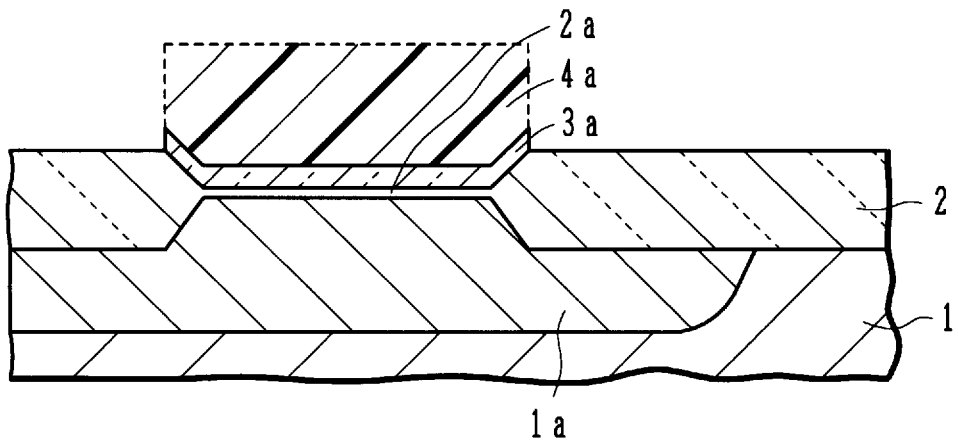
FIGS. 2A to 2F are cross sectional views of a substrate illustrating the main processes of manufacturing the memory cell shown in FIG. 1.

With reference to FIG. 2A, the processes up to a step of forming a field oxide film on a semiconductor substrate will be described. The processes up to this step follow the usual manufacture steps for a MOS (metal oxide semiconductor) transistor. In this embodiment, an n-channel MOS transistor is formed illustratively. For a p-channel MOS transistor, the conductivity type in the following description is reversed.

First, on the surface of an Si semiconductor substrate 1, a thermal oxide film is formed through thermal oxidation. A resist film is coated on the surface of the thermal oxide film by a spinner. A resist pattern is then formed by exposure and development processes. By using this resist pattern as an etching mask, the thermal oxide film is etched.

By using the obtained thermal oxide film pattern and the resist pattern left thereon as an ion implantation mask, ions imparting p-type conductivity, e.g., B (boron) ions, are implanted. Thereafter, the resist pattern is removed, and the implanted layer is subjected to heat treatment to form a p-type well 1a shown in FIG. 2A. The ion implantation conditions are, for example, an acceleration energy of 30 keV and an ion dose of $1.5 \times 10^{13}/cm^2$. Thereafter, the left thermal oxide film is etched and removed.

The surface of the semiconductor substrate 1 is again thermally oxidized to form a thin oxide film 2a of about 10 nm thick over the whole surface of the substrate. A silicon nitride film of about 140 nm thick is then formed over the whole surface of the substrate.

A resist film is coated on the surface of the silicon nitride film by a spinner. By exposure and development processes, a resist film pattern 4a is formed so that the silicon nitride film is exposed only at the regions where a field oxide film is to be formed. By using this resist film pattern 4a as an etching mask, the exposed silicon nitride film is dry-etched with etching gas of $CF_4$ to obtain the silicon nitride film pattern 3a shown in FIG. 2A. Thereafter, the resist film pattern 4a is removed (in the following usual patterning processes using a resist film, a similar method as above is assumed).

By using this silicon nitride film pattern 3a as a mask, thermal oxidation is performed at about 1100° C. to form, as shown in FIG. 2A, a thick field oxide film 2 at the region not covered with the mask. Thereafter, the silicon nitride film pattern 3a is etched and removed.

Figure 2B:
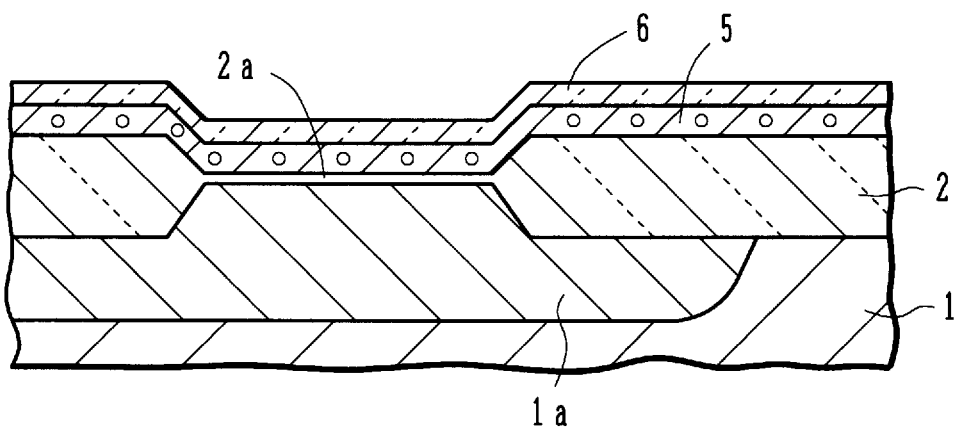

Next, as shown in FIG. 2B, a first level polysilicon film 5 is formed on the substrate surface by low or reduced pressure CVD (chemical vapor deposition). This CVD is performed using reaction gas of $SiH_4$ under the conditions of a total gas pressure of 0.3 Torr and a substrate temperature of about 600° C.

In order to impart conductivity to this first level polysilicon film 5, n-type impurity, e.g., P (phosphorous), is doped to the polysilicon film 5. If this impurity doping is to be performed by ion implantation, this implantation is carried out under the conditions of, for example, an acceleration energy of 30 keV and an ion dose of $10^{16}$ ions/$cm^2$. Alternatively, the polysilicon film may be subjected to thermal treatment at 800° to 900° C. in a $POCl_3$ ambient atmosphere to diffuse P into the polysilicon film. A measure of dose is at about $10^{20}$ ions/$cm^3$.

On the impurity doped first level polysilicon film 5, a thin silicon nitride film 6 is formed by CVD. The silicon nitride film is thinner the better in order to increase the capacitance per unit area. For example, a film thickness is 4 nm. Reaction gas used by CVD for forming the silicon nitride is $SiH_2Cl_2$ and $NH_3$, an ambient pressure is 0.4 Torr, and a substrate temperature is 770° C.

Figure 2C:
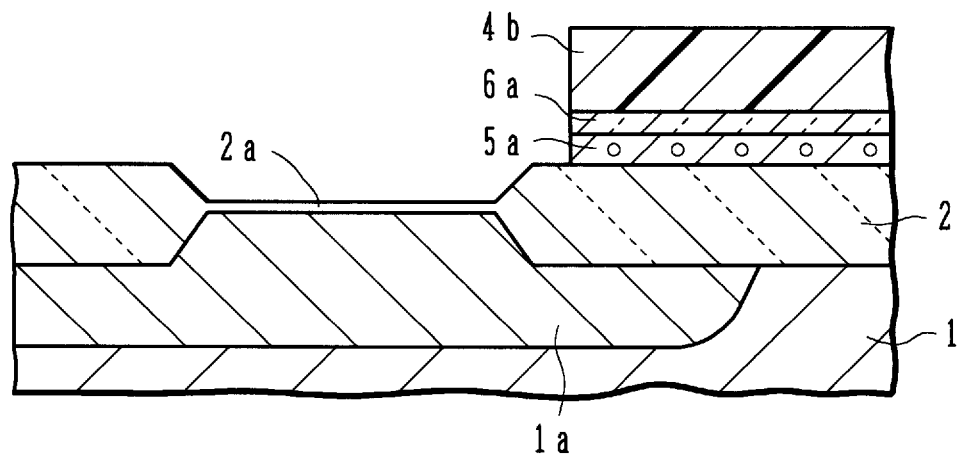
Figure 2D:
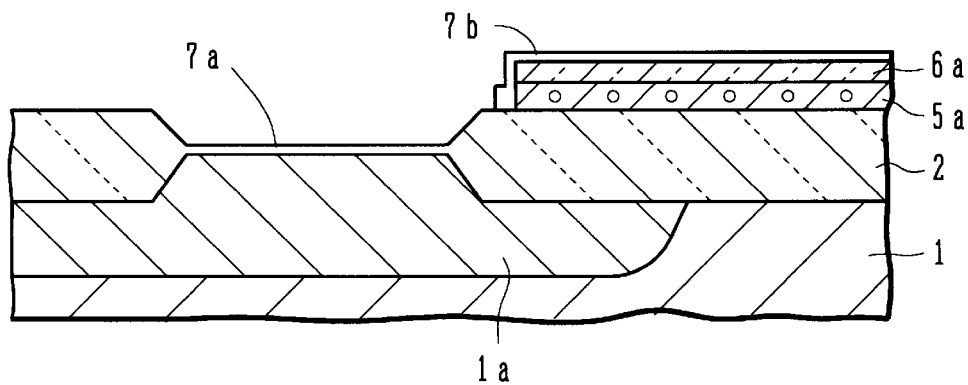

As shown in FIG. 2C, a resist film pattern 4b is formed in the area where a capacitor is formed. By using this resist film pattern 4b as an etching mask, the two layers of the silicon nitride film 6 and first level polysilicon film 5 are dry-etched in succession.

First, the silicon nitride film 6 is etched by using $CF_4$ as etching gas to leave a silicon nitride film pattern 6a. Next, by using the resist film pattern 4b and silicon nitride film pattern 6a as an etching mask, the first level polysilicon film 5 is etched by changing the etching gas to mixed gas of $Cl_2$ and $O_2$ to leave a first level polysilicon film pattern 5a.

Although the etching gas is different, these two etching processes use the same resist mask so that they can be carried out successively or continuously in the same dry etching system.

As shown in FIG. 2C, the first level polysilicon film pattern 5a and the silicon nitride film pattern 6a on the pattern 5a are formed on the field oxide film 2. These patterns correspond to a lower capacitor electrode and a dielectric layer formed on the lower electrode.

Thereafter, B ions are implanted into the surface layer of the active region by using the field oxide film and resist film pattern 4b as an ion implantation mask. Implantation of B ions adjusts a threshold value of the transistor. In this embodiment, this implantation of B ions is performed under the conditions of, for example, an acceleration energy of 20 keV and an ion dose of $1 \times 10^{12}$ ions/$cm^2$. Under these conditions, B ions are not implanted into the polysilicon film pattern 5a and silicon nitride film pattern 6a, but are implanted only into the surface layer of the active region and form a thin B ion implanted layer (not shown). After the ion implantation, the resist film pattern 4b is removed.

Next, the substrate surface is wet-etched by HF solution to remove the exposed thin oxide film 2a and an exposed thin surface layer of the field oxide film 2.

As shown in FIG. 2D, the substrate is again subjected to thermal oxidation at 900° C. for about 20 minutes to form a new SiO$_2$ film 7a of about 11 nm thick. This SiO$_2$ film 7a is used as the gate oxide film of the transistor.

At the same time, the surface of the silicon nitride film 6a is also oxidized and an oxide film 7b is formed. This oxide film 7b is as thin as about 1 nm because the silicon nitride film is less oxidized than Si. If the silicon nitride film 6a has pin holes, the pin holes are buried or filled with an oxide film grown from the exposed, underlying polysilicon film, resulting in vanishing of pin holes in the capacitor dielectric layer.

An oxide film is also formed on the side wall of the first level polysilicon layer pattern 5a serving as the lower capacitor electrode. This SiO$_2$ film formed on the side wall of the first level polysilicon film pattern 5a is thicker than the oxide film formed on the side wall of the silicon nitride film pattern 6a.

A second level polysilicon film is formed over the substrate surface to a thickness of about 300 nm by CVD. Reaction gas used for CVD is SiH$_4$, an ambient gas pressure is 0.3 Torr, and a substrate temperature is 600° C.

Figure 2E:
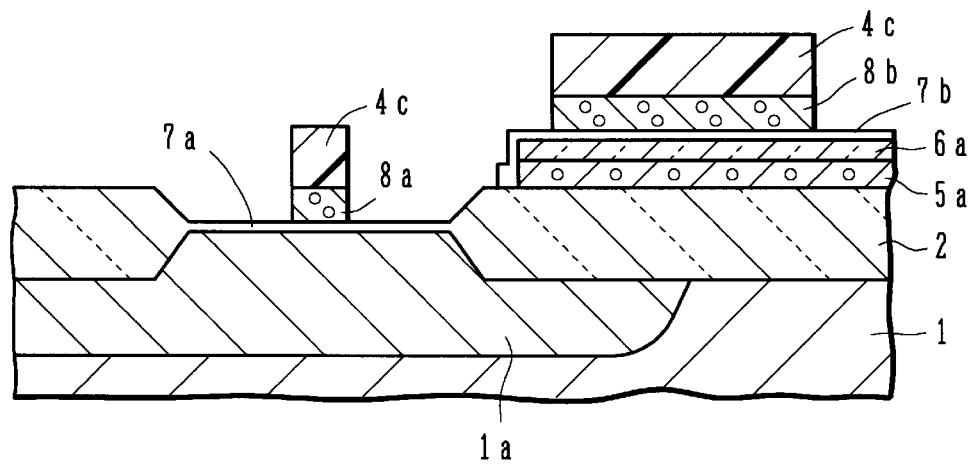

Thereafter, in order to impart conductivity to the second level polysilicon film, impurities are doped to this film. For example, P ions are doped by ion implantation or thermal diffusion from a POCl$_3$ atmosphere. The ion implantation or thermal diffusion conditions may be the same as the conditions used for n-type impurity doping to the firs level polysilicon film. Thereafter, a resist film pattern 4c shown in FIG. 2E is formed on the impurity doped second level polysilicon film.

By using the resist film pattern 4c as an etching mask, the second polysilicon film is dry-etched to leave second level polysilicon film patterns 8a and 8b. These patterns 8a and 8b are used as the transistor gate electrode and the upper capacitor electrode. The etching gas used for dry etching is mixed gas of Cl$_2$ and O$_2$. This etching gas can etch the polysilicon film at a higher etching rate than the SiO$_2$ film so that the first level polysilicon film pattern 5a as the lower capacitor electrode and the dielectric layer 6a are hardly etched. Thereafter, the resist film pattern 4c is removed.

With the above processes, the capacitor on the field oxide film and the gate electrode of the transistor are formed. The gate electrodes of n-channel transistors of the logic circuit are formed by the same processes. Thereafter, other transistor constituent elements are formed in the active region.

Transistors are formed by usual MOS transistor manufacture processes.

In the following, the other transistor manufacture processes for completing a DRAM memory cell will be described with reference to FIG. 2F.

Impurity ions are implanted to impart conductivity to the source/drain regions by using the gate electrode 8a as an ion implantation mask. For example, P ions are implanted into the substrate under the conditions of an acceleration energy of 30 keV and an ion implantation dose of 5.0×10$^{15}$ ions/cm$^2$.

The substrate is annealed at about 850° to 1000° C. by using an RTA (rapid thermal annealing) system to activate implanted ions. In this manner, the source region 9a and drain region 9b of the transistor are formed as shown in FIG. 2F.

Next, an interlayer insulating film 10 is formed over the whole surface of the substrate. This interlayer insulating film is, for example, a two-layer film of a PSG (phosphosilicate glass) of about 100 nm thick and a BPSG (borophosphosilicate glass) of about 600 nm thick, respectively formed by atmospheric pressure (i.e./atm) CVD.

Contact or connection holes are formed in the interlayer insulating film 10 at predetermined positions by a usual patterning process using a resist pattern.

A barrier metal such as WSi is formed about 50 nm thick over the whole surface of the substrate by sputtering. On this WSi film, Al alloy layer of Al, Si, and Cu is formed about 800 nm thick by sputtering.

The wiring or interconnection layer is etched by a usual patterning process using a resist mask, to form a desired wiring pattern.

Figure 2F:
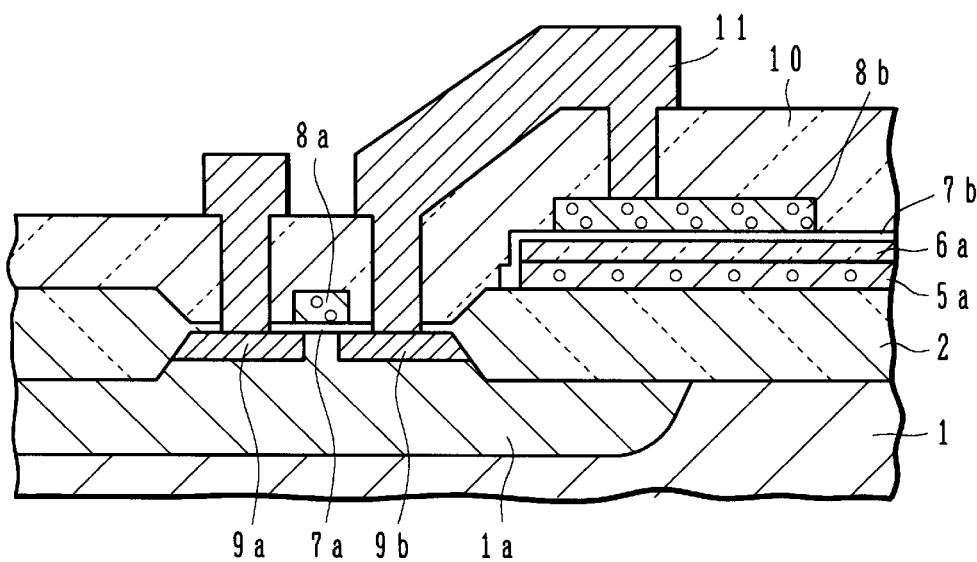

With the above processes, a DRAM memory cell having one transistor and one capacitor such as shown in FIG. 2F is completed.

The above-described transistor manufacture processes are the same as the manufacture processes for n-channel transistors of the logic circuit built in LSI. Therefore, both the DRAM memory cells and n-channel transistors of the logic circuit are formed concurrently. For a CMOS circuit, the manufacture processes for p-channel transistors are performed in addition to the above processes.

As above, according to the manufacture method of this embodiment, a capacitor is first formed on the field oxide film, and then a transistor is formed. Thermal CVD at a high temperature is often used for manufacturing the dielectric layer of a capacitor. Therefore, if transistors are formed before capacitors are formed as in conventional memory cell manufacture processes, this high temperature processes for capacitors may degrade the transistor characteristics. However, with the manufacture method of this embodiment, this problem can be solved because capacitors are first formed.

Since it is not necessary to consider the influence of high temperature processes on the transistor characteristics, the substrate temperature can be raised further during CVD processes for forming the dielectric layer. Therefore, a silicon nitride film of better film quality having a higher dielectric constant can be formed.

In this embodiment, the dielectric layer and lower electrode of a capacitor are patterned in succession by using the same mask. Therefore, an etching mask forming process for patterning the lower capacitor electrode can be omitted.

Furthermore, since the upper capacitor electrode and transistor gate electrode are made of the same polysilicon film and etched and patterned at the same time, a process load can be alleviated.

As described already, pin holes in the silicon nitride film, if any, are buried by the formation of the oxide film on the silicon nitride film serving as the capacitor dielectric layer. In this embodiment, this oxide film is formed at the same time when the transistor gate oxide film is formed. Therefore, the reliability of capacitors can be improved without increasing the number of processes.

Because of reduction of such processes, the built-in memory cell manufacture processes of this embodiment include the usual logic circuit manufacture processes which are mainly transistor manufacture processes, and only additional manufacture processes for the lower capacitor electrode and the silicon nitride film as the dielectric layer, considerably reducing a load on LSI manufacture processes.

3. Layout on Substrate

Figure 3:
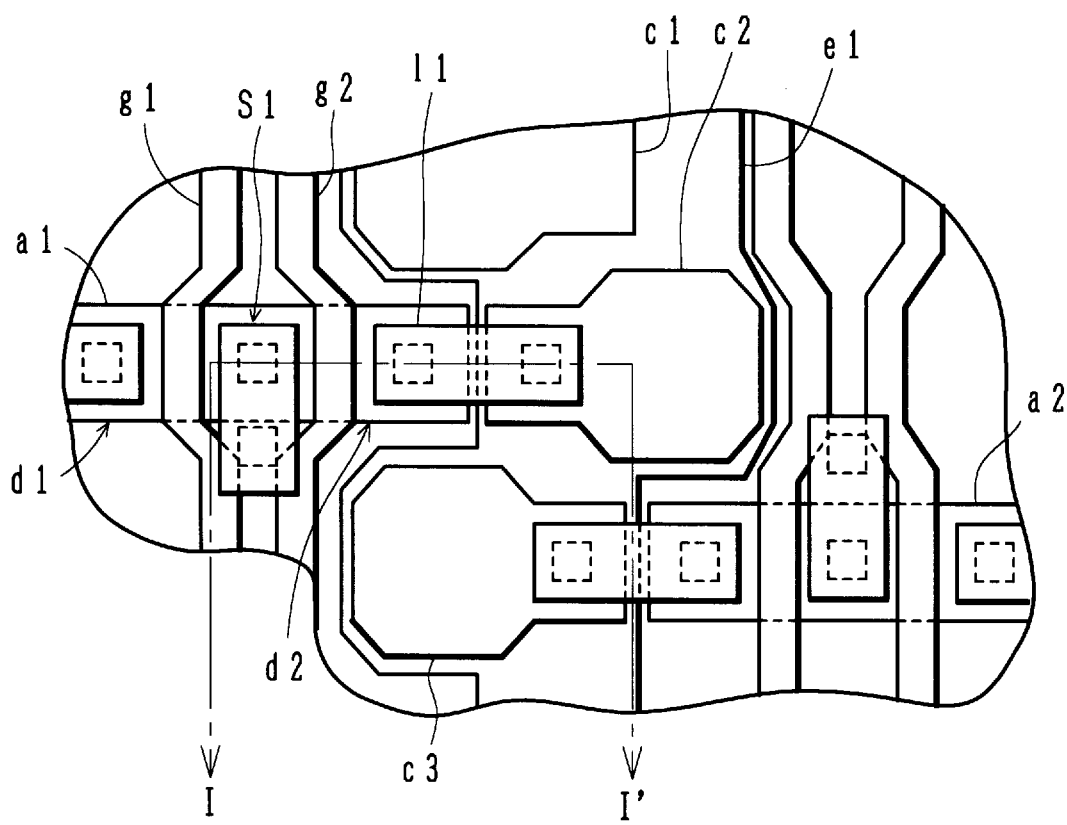
FIG. 3 is a plan view of a substrate showing the layout of a memory cell on the substrate.
Figure 4A:
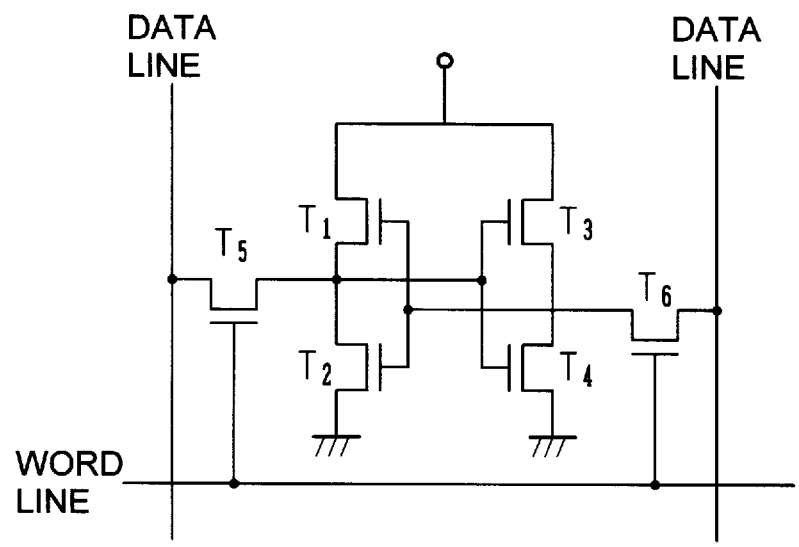
FIGS. 4A and 4B are circuit diagrams of semiconductor memory cells.
Figure 4B:
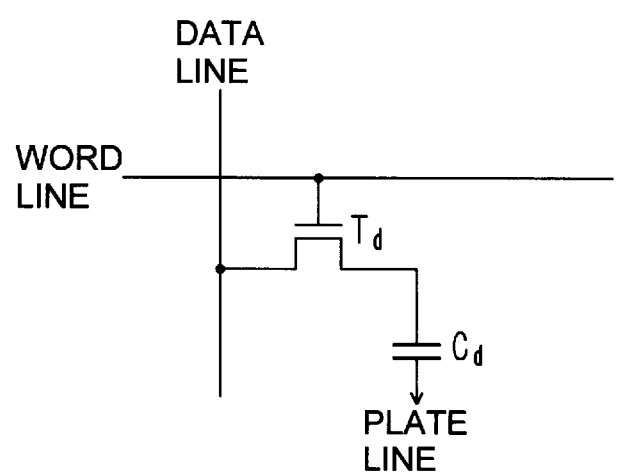

FIG. 3 shows a part of the layout of a memory cell array having a plurality of DRAM memory cells of the embodiment disposed on a substrate. The cross section taken along one-dot chain line I-I' corresponds to the cross sectional view of the memory cell shown in FIG. 1. Each memory cell is constituted by one transistor and one capacitor.

Active regions a1 and a2 are defined by a field oxide film. As shown in FIG. 3, two transistors are disposed on the right and left of the central source region which is used in common by the two transistors. For example, in the case of the active region a1, gate lines g1 and g2 in this active region correspond to the gate electrodes of the two transistors, and the region between the two gate lines is the source region Si shared by the two transistors. Drain regions d1 and d2 are formed on the left side of the gate line g1 and on the right side of the gate line g2.

On the right and left of each active region, a capacitor for each transistor is formed. Each capacitor is connected to the drain region of an adjacent transistor. For example, the capacitor c2 is connected to the transistor drain region d2 by an interconnection 11.

The lower capacitor electrode e1 is used in common for a plurality of capacitors. Therefore, an area of each capacitor is determined by the upper capacitor electrodes c1 to c3. The wider portions of the adjacent upper electrodes c1 and c2, and c2 and c3 in the vertical direction are shifted or off-set in the horizontal direction as shown in FIG. 3 to obtain broad electrode areas.

A size of a conventional memory cell of SRAM using six transistors is about 55 $\mu m^2$ by using 0.5 $\mu m$ rule processes. In order for a planar type DRAM to obtain an electrostatic capacitance of the same performance, a cell size of about 20 $\mu m^2$ is required. In contrast, using the cell structure and processes of this embodiment, a size of a memory cell having the same electrostatic capacitance can be reduced to about 10 to 15 $\mu m^2$.

With this embodiment, the size of a built-in memory cell can be made small and a necessary chip area can be reduced. Since the number of processes to be added to usual logic circuit manufacture processes is small, a load on the total LSI manufacture processes can be alleviated. Manufacture yield as a function of a defect occurrence ratio and a chip area can be improved. Since the total number of processes is small, manufacture cost can be prevented from being raised. As compared to a conventional SRAM, the chip cost of 1 Mbit memories can be lowered considerably as a whole.

The present invention has been described in connection with the preferred embodiments. The invention is not limited only to the above embodiments. For example, although the memory cell of this embodiment uses a silicon nitride film as the capacitor dielectric layer, other materials of a high dielectric constant such as $Ta_2O_5$ and $SrTiO_3$ may also be used. As the lower capacitor electrode, refractory metal, refractory metal silicide, and other materials may also be used. In this embodiment, although an n-channel MOS transistor is used, a p-channel MOS transistor may be used. It is apparent to those skilled in the art that various modifications, improvements, combinations and the like can be made without departing from the scope of the appended claims.

I claim:

1. A semiconductor device with a semiconductor memory comprising:

a semiconductor substrate having a surface;

an insulating film formed on the surface of the semiconductor substrate and surrounding an active region;

a transistor formed in the active region comprising source and drain regions formed in a surface layer of the semiconductor substrate, a gate insulating film formed on the surface of the semiconductor substrate, and a gate electrode made of an oxidizable substance and formed on the gate insulating film between the source and drain regions;

a capacitor formed on said insulating film and having a first conductive layer, a dielectric layer, and a second conductive layer stacked in this order, the dielectric layer including a first dielectric sub-layer and a second dielectric sub-layer formed from the same material as that of the gate insulating film and formed on the first dielectric sub-layer, the first conductive layer and the first dielectric sub-layer having the same planar pattern defined by their respective edges and the second dielectric sub-layer covering the upper surface of the first dielectric sub-layer and sidewalls of the first dielectric sub-layer and the first conductive layer, and an area of the second conductive layer being smaller than the respective areas of the first conductive layer and the dielectric layer and a contour of the second conductive layer fully running inside areas of the first conductive layer and the dielectric layer, and wherein the second conductive layer and the gate electrode are formed from the same layer, and said insulating film upon which said capacitor is formed having a thickness which is larger than said gate insulating film and the same thickness as the insulating film immediately adjacent said active region.

2. A semiconductor device with a semiconductor memory according to claim 1, wherein the gate insulating film is a thermally oxidized silicon oxide film, the first dielectric sub-layer is a silicon nitride film, and the second dielectric sub-layer is a thermally oxidized film formed on the first dielectric sub-layer.

3. A semiconductor device according to claim 1, wherein said dielectric layer includes a layer formed of tantalum oxide or strontium titanium oxide.

4. A semiconductor device with a semiconductor memory comprising:

a semiconductor substrate having a surface;

an insulating film formed on the surface of the semiconductor substrate and surrounding an active region, a transistor formed in the active region comprising source and drain regions formed in a surface layer of the semiconductor substrate, a gate insulating film formed on the surface of the semiconductor substrate, and a gate electrode made of an oxidizable substance and formed on the gate insulating film between the source and drain regions;

a capacitor formed on said insulating film and having a first conductive layer, a dielectric layer, and a second conductive layer stacked in this order, the dielectric layer including a first dielectric sub-layer and a second dielectric sub-layer formed from the same material as that of the gate insulating film and formed on the first dielectric sub-layer, the first conductive layer and the first dielectric sub-layer having the same planar pattern defined by their respective edges and the second dielectric sub-layer covering the upper surface of the first dielectric sub-layer and sidewalls of the first dielectric sub-layer and the first conductive layer, and an area of the second conductive layer being smaller than the respective areas of the first conductive layer and the dielectric layer and a contour of the second conductive layer fully running inside areas of the first conductive layer and the dielectric layer, wherein the second conductive layer and the gate electrode are formed from the same layer, and said insulating film upon which said capacitor is formed having the same thickness as the insulating film immediately adjacent said active region;

an interlayer insulating film formed to cover the transistor and the capacitor;

connection holes formed through the interlayer insulating film to reach said drain region and said second conductive layer; and an interconnect formed on said interlayer insulating film to connect said drain region and said second conductive layer.

5. A semiconductor device according to claim 4, wherein said insulating film defines a plurality of active regions, the device further comprising transistors formed in other active regions and constituting a logic circuit.

* * * * *